United States Patent
Wallerath et al.

(10) Patent No.: US 11,360,127 B2
(45) Date of Patent: Jun. 14, 2022

(54) DEVICE AND METHOD FOR SELF-ADJUSTING AN ELECTRICAL THRESHOLD FOR DETECTING A POWER FAILURE

(71) Applicant: APTIV TECHNOLOGIES LIMITED, St. Michael (BB)

(72) Inventors: Jörg Wallerath, Essen (DE); Emmanuel Boudoux, Cologne (DE)

(73) Assignee: APTIV TECHNOLOGIES LIMITED

( * ) Notice: Subject to any disclaimer, the term of this patent is extended or adjusted under 35 U.S.C. 154(b) by 181 days.

(21) Appl. No.: 16/713,487

(22) Filed: Dec. 13, 2019

(65) Prior Publication Data
US 2020/0191839 A1  Jun. 18, 2020

(30) Foreign Application Priority Data
Dec. 14, 2018  (FR) ..................................... 1872944

(51) Int. Cl.
G01R 19/00 (2006.01)
G01R 19/165 (2006.01)
G01R 19/25 (2006.01)
G06F 1/28 (2006.01)

(52) U.S. Cl.
CPC ... *G01R 19/16542* (2013.01); *G01R 19/2513* (2013.01); *G06F 1/28* (2013.01)

(58) Field of Classification Search
USPC ........ 324/658, 660–663, 679, 686; 361/100; 345/212
See application file for complete search history.

(56) References Cited

U.S. PATENT DOCUMENTS

| | | | |
|---|---|---|---|
| 3,935,569 A | 1/1976 | Marcel et al. | |
| 7,656,148 B1 | 2/2010 | Li | |
| 2009/0116161 A1* | 5/2009 | Takahashi | H03K 17/687 361/100 |
| 2013/0200875 A1 | 8/2013 | Ishihara | |
| 2015/0062108 A1* | 3/2015 | Archibald | H02M 3/156 345/212 |
| 2015/0288223 A1* | 10/2015 | Sato | H02J 9/061 307/66 |
| 2015/0301104 A1 | 10/2015 | Pounds et al. | |

FOREIGN PATENT DOCUMENTS

EP  0130646 A1  1/1985

OTHER PUBLICATIONS

Search Report and Written Opinion, dated Nov. 19, 2019.

* cited by examiner

*Primary Examiner* — Vincent Q Nguyen
(74) *Attorney, Agent, or Firm* — Billion & Armitage

(57) ABSTRACT

A device for self-adjusting an electrical threshold includes a framing unit that compares a setpoint signal representative of the supply signal to a plurality of successive intervals of reference signals that increase in value according to a geometric sequence. The framing unit generates an output based on the interval bounding the setpoint signal, wherein the output controls a switch that is configured to provide one of the plurality of reference signals as an output, wherein the output reference signal is representative of the electrical detection threshold.

9 Claims, 4 Drawing Sheets

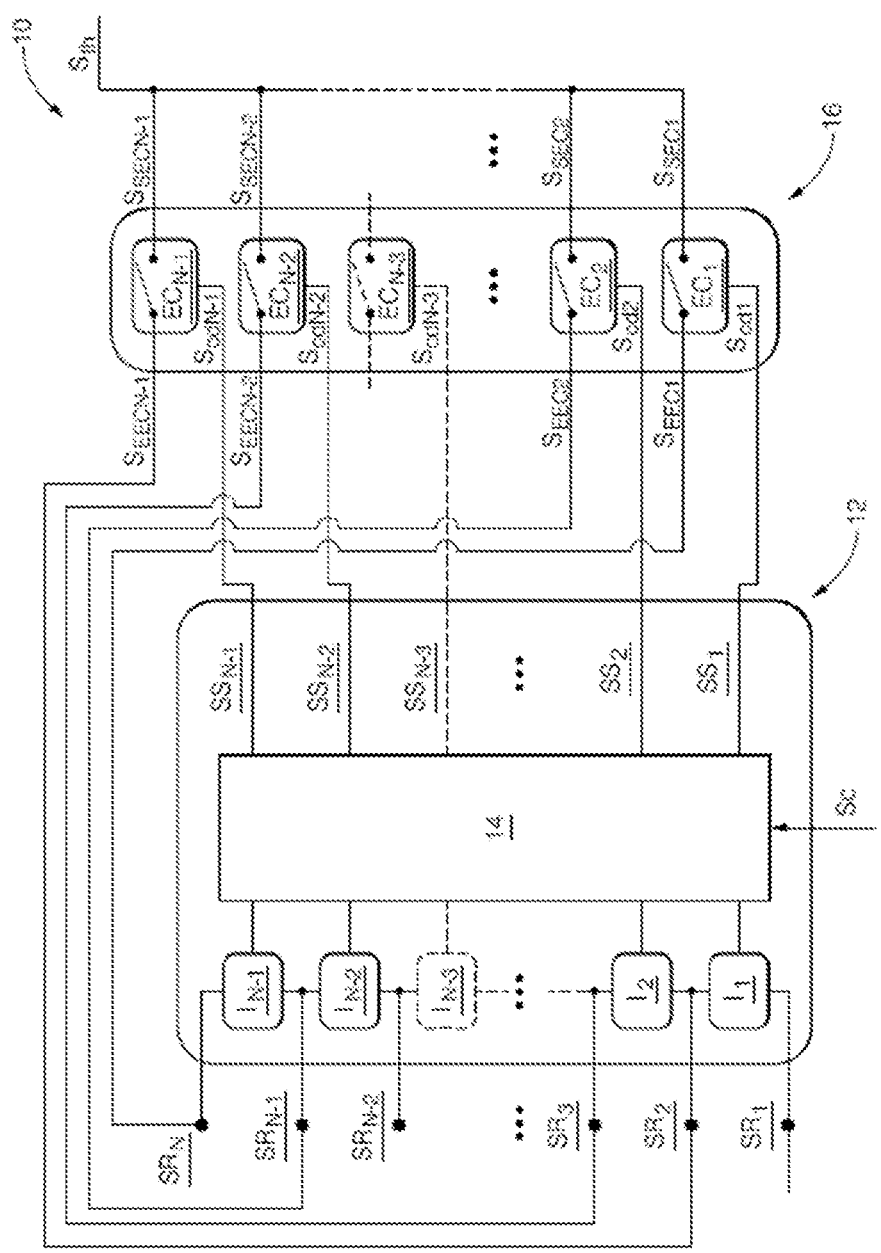
[Fig 1]

[Fig 2]
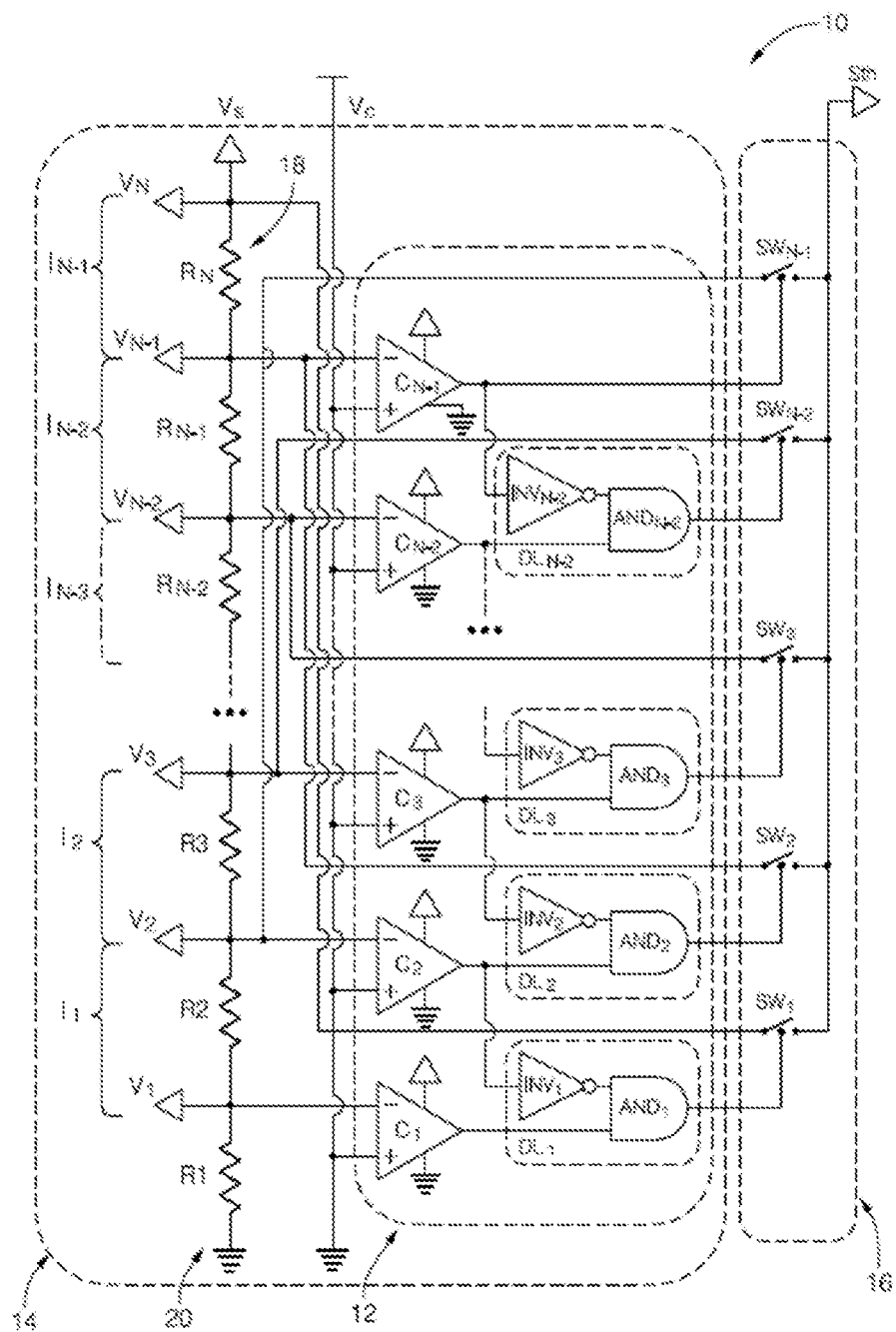

[Fig 3]
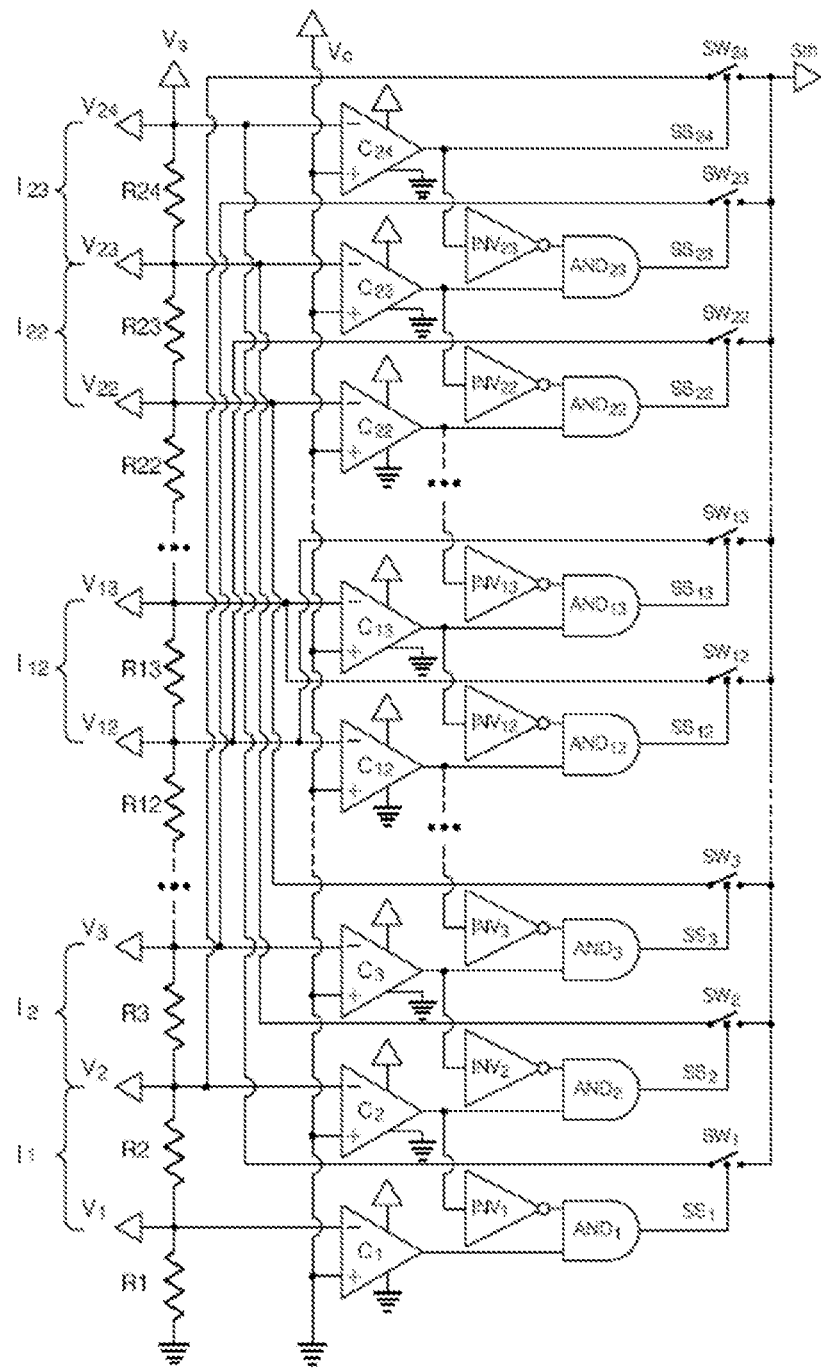

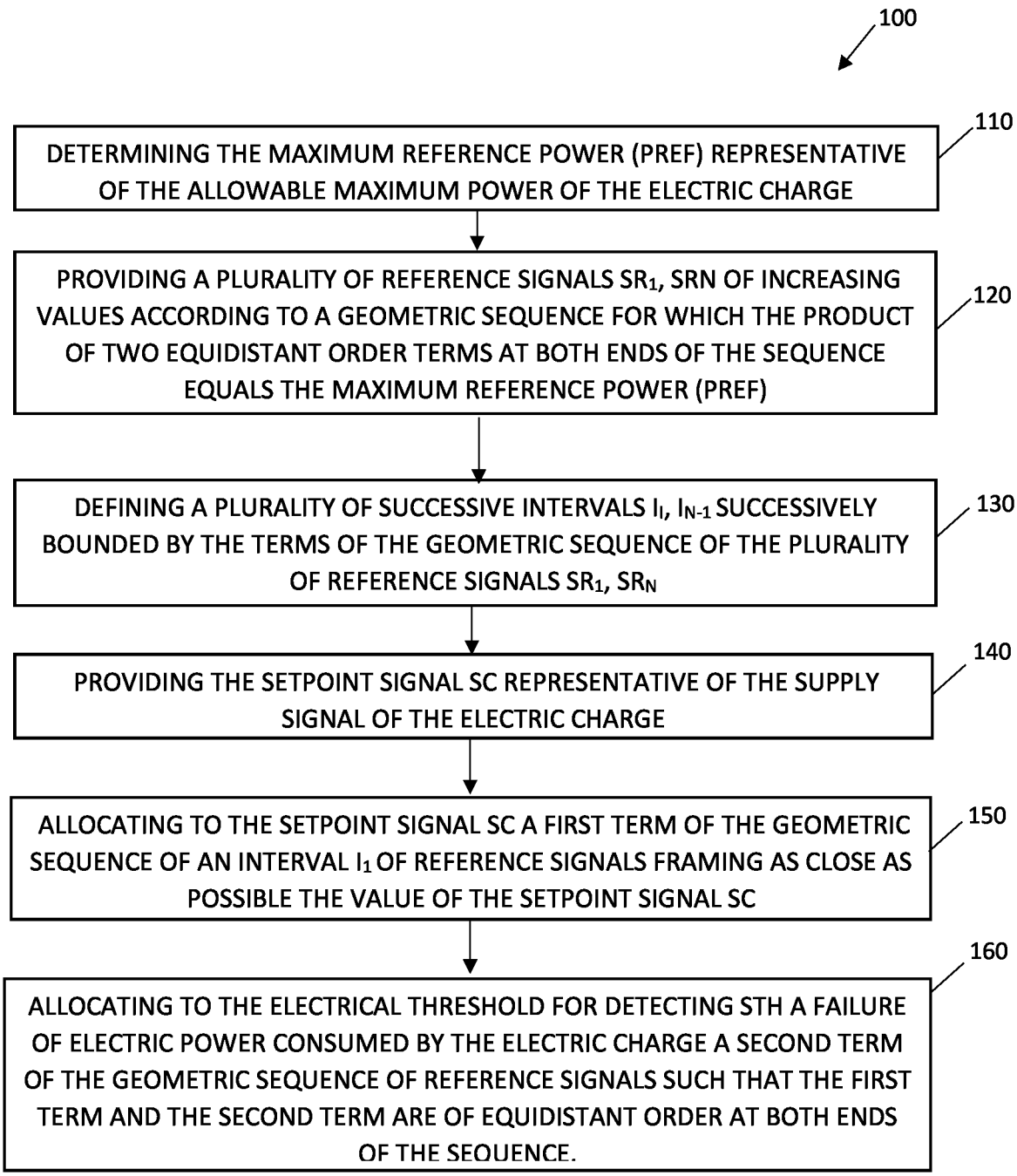
[Fig 4]

DEVICE AND METHOD FOR SELF-ADJUSTING AN ELECTRICAL THRESHOLD FOR DETECTING A POWER FAILURE

TECHNICAL FIELD

The present invention relates to a device for self-adjusting an electrical threshold for detecting a power failure as well as to a method for determining the electrical threshold for detecting a power failure.

STATE OF THE ART

In the automotive electronic device, it is known to supervise the power consumption of an electric charge. In order to supervise a power excess or a power failure of the electric charge, it is known to control the product of the supply voltage of the charge by the current consumption of the charge in order to evaluate the power consumption. The power consumption of the charge thus calculated is then compared with a maximum power threshold beyond which an electric charge failure can be diagnosed, and/or also with a minimum power threshold below which an electric charge failure can also be diagnosed.

The existing devices require computing power as well as reaction times penalizing the consumption and responsiveness of the existing devices.

It is therefore important to propose a new solution solving this problem.

SUMMARY OF THE INVENTION

According to the invention, a device for self-adjusting an electrical threshold for detecting an electric power consumption failure of an electric charge, preferably of the charge of a motor vehicle, comprises a plurality of reference signals of increasing values according to a geometric sequence for which the product of two terms of equidistant order at both ends of the sequence equals a maximum reference power (Pref), the plurality of reference signals being representative of the variation of a supply signal of the electric charge; the device further comprises a setpoint signal representative of the supply signal of the electric charge; a framing unit including a plurality of successive intervals of reference signals sequentially bounded by the terms of the geometric sequence of the plurality of reference signals, the device further comprises a measurement signal including the setpoint signal, a plurality of output signals, logic signal processing means configured to assign to a first output signal of the plurality of output signals a binary state of belonging of the setpoint signal to a first interval of reference signals including a first term of the geometric sequence, and at least one electrical switch configured to be controlled by the first output signal and configured to provide a reference signal of the plurality of reference signals of a value of a second term of the geometric sequence, such that the first term and the second term are of equidistant order at both ends of the geometric sequence, the second term being representative of the electrical threshold for detecting an electric power consumption failure of the electric charge.

The logic signal processing means may be configured to assign to the other binary output signals of the plurality of binary output signals a binary state of nonbelonging of the setpoint signal to the other intervals of reference signals.

The plurality of reference signals may comprise successive electrical connection nodes of a resistor network in series.

The logic signal processing means may include a plurality of comparators ordered from 1 to N each comprising respectively a reference signal ordered from 1 to N of the plurality of reference signals, each comparator also comprising the setpoint signal, so as to be able to compare the setpoint signal with each reference signal; a plurality of logic devices ordered from 1 to N−1 comprising a plurality of 'inverter'-type logic gates ordered from 1 to N−1, each input of each 'inverter'-type logic gate of order 1 to N−1 being respectively electrically connected to the output of each comparator of order 2 to N; and also comprising a plurality of two-input 'AND'-type logic gates ordered from 1 to N−1, each first input of each two-input 'AND'-type logic gate ordered from 1 to N−1 being respectively electrically connected to each output of each 'inverter'-type logic gate ordered from 1 to N−1, each second input of each two-input 'AND'-type logic gate ordered from 1 to N−1 being respectively electrically connected to each ordered output of each comparator of order 1 to N−1; the plurality of 'AND'-type logic gates of order 1 to N−1 including respectively the plurality of output signals ordered from 1 to N−1 of the framing unit.

According to the invention, a method for determining an electrical threshold for detecting a failure of electric power consumed by an electric charge, preferably an electric charge of a motor vehicle, comprises the steps of:

determining a maximum reference power (Pref) representative of the maximum allowable power of the electric charge;

providing a plurality of reference signals of increasing values according to a geometric sequence for which the product of two terms of equidistant order at both ends of the sequence equals the maximum reference power (Pref); the plurality of reference signals being representative of the variation of a supply signal of the electric charge;

defining a plurality of successive intervals of reference signals successively bounded by the terms of the geometric sequence of the plurality of reference signals;

providing a setpoint signal representative of the supply signal of the electric charge;

allocating to the setpoint signal a first term of the geometric sequence of an interval of reference signals framing as close as possible the value of the setpoint signal;

allocating to the electrical threshold for detecting a failure of electric power consumed by the electric charge a second term of the geometric sequence of reference signals such that the first term and the second term are of equidistant order at both ends of the sequence.

Other objects and advantages of the present invention will become apparent in light of the following description.

BRIEF DESCRIPTION OF THE DRAWINGS

Other characteristics, objects and advantages of the invention will become apparent upon reading the following detailed description, and in light of the appended drawings given by way of non-limiting example and in which:

FIG. 1 represents a block diagram of the device for self-adjusting an electrical threshold for detecting a power failure according to a first embodiment of the invention.

FIG. 2 represents a block diagram of the self-adjusting device according to a second embodiment of the invention.

FIG. 3 represents a block diagram of the self-adjusting device according to a third embodiment of the invention.

FIG. 4 represents a flowchart of a method for determining an electrical detection threshold according to a first embodiment of the method.

DETAILED DESCRIPTION

According to FIG. 1, a device for self-adjusting 10 an electrical threshold for detecting Sth an electric power failure of an electric charge is represented. Preferably, said threshold is a comparison threshold provided to be able to detect an electric power consumption failure of a charge of a motor vehicle.

The self-adjusting device 10 is configured to provide a self-adjusting electrical threshold for detecting an electric power failure based on the variations of a supply signal of the electric charge.

The self-adjusting device 10 comprises a plurality of reference signals SRI, $SR_N$ of increasing values according to a geometric sequence for which the result of the product of any two terms of equidistant order at both ends of the sequence is generally constant. The result of the product of the any two terms of equidistant order at both ends is also equivalent to the product of the ends of the geometric sequence. The particularity of the invention lies in the exploitation of this property specific to the geometric suites. According to the invention, although the terms of the geometric sequence representative of the plurality of reference signals $SR_1$, $SR_N$ are of the same nature, namely representative of an electric current or of an electric voltage, the absolute value of each of two equidistant terms from the ends of the sequence is an image for one of the two terms of the value of a supply voltage of the electric charge, the other term being the image of a supply current of the electric charge, so that the product of the value of the two terms represent an image of a maximum reference power (Pref) representative of the maximum power allowable by the electric charge. The plurality of reference signals $SR_1$, $SR_N$ is therefore an image of the possible variation of a supply signal of the electric charge.

The power supply of an electric charge of a motor vehicle may, for example, in a non-limiting manner, in some cases, vary between 0 Volt, during a power cutoff, up to 18 volts depending on the conditions of use of the vehicle battery. The plurality of reference signals $SR_1$, $SR_N$ is generally an indirect representation of the variations of the battery voltage; in other words, the plurality of reference signals $SR_1$, $SR_N$ comprises reference signals ($SR_1$, $SR_N$) of values proportional to the values of voltages of the vehicle battery.

In order to supervise the electric power consumed by the electric charge, the self adjusting device 10 comprises a setpoint signal Sc representative of the supply signal of the electric charge. The setpoint signal Sc can be directly the supply signal of the electric charge, such as the voltage of the vehicle battery or the electric current consumed by the charge on the battery, or an image of the supply signal of the electric charge, such as a reduced value of the voltage of the battery or a reduced value of the electric current consumed by the charge on the battery.

According to FIG. 1, the self-adjusting device 10 comprises a framing unit 12 including as input signals a plurality of successive intervals $I_1$, $I_2$, $I_{N-1}$ of the type $[SR_1, SR_2[$, $[SR_2, SR_3[$, $[SR_{N-1}, SR_N[$ successively bounded by the terms of the geometric sequence of the plurality of reference signals $SR_1$, $SR_N$ and also a measurement signal including the setpoint signal Sc. The framing unit 12 is configured to determine an interval $I_2$ bounded by two successive terms of the geometric sequence, that is to say by two values of the successive reference signals of the type $[SR_2, SR_3[$, for framing the value of the setpoint signal Sc.

The framing unit 12 also comprises a plurality of binary output signals $SS_1$, $SS_{N-1}$ and logic signal processing means 14 configured to assign to a first binary output signal $SS_2$ of the plurality of binary output signals $SS_1$, $SS_{N-1}$ a binary state of belonging of the setpoint signal Sc to a first interval $I_2$ of the type $[SR_2, SR_3[$ including a first term of the geometric sequence of a value of the reference signal $SR_2$ of lower bound of the first interval $I_2$. A belonging binary state may be a 'high' logic level, i.e. a binary value of '1'.

The logic signal processing means 14 are also configured to assign to the other binary output signals $SS_1$, $SS_3$, $SS_{N-1}$ of the plurality of binary output signals $SS_1$, $SS_{N-1}$ a binary state of nonbelonging of the setpoint signal Sc to the other intervals $I_1$, $I_3$, $I_{N-1}$ of the type $[SR_1, SR_2[$, $[SR_3, SR_4[$, $[SR_{N-1}, SR_N[$. A nonbelonging binary state may be a 'low' logic level, i.e. a binary value of '0'.

In other words, each interval $I_1$, $I_{N-1}$ of the type $[SR_1, SR_2[$, $[SR_{N-1}, SR_N[$ cooperates with a determined binary output signal $SS_1$, $SS_{N-1}$ of the framing unit 12 so that the binary state of each binary output $SS_1$, $SS_{N-1}$ indicates the belonging or nonbelonging of the value of the setpoint signal Sc to a single determined interval $I_2$ of the type $[SR_2, SR_3[$. The value of the setpoint signal Sc is representative of the amplitude of the supply signal of the charge.

According to FIG. 1, the self-adjusting device 10 includes a switching unit 16 comprising a plurality of electrical switches $EC_1$, $EC_{N-1}$ each able to switch a single reference signal $SR_{N-1}$ of the plurality of reference signals $SR_1$, $SR_N$, each reference signal $SR_1$, $SR_N$ being each able to be switched by a single electrical switch $EC_2$. Each electrical switch $EC_1$, $EC_{N-1}$ is an element with an input $S_{EEC1}$, $S_{EECN-1}$, an output $S_{SEC1}$, $S_{SECN-1}$ and a control signal $S_{cd1}$, $S_{cdN-1}$ allowing the switching of the input signal $S_{EEC1}$ of the switch on its output $S_{SEC1}$.

According to the embodiment of FIG. 1, one of the electrical switches $EC_2$ is configured to be controlled by the first binary output signal $SS_2$ and is configured to provide a reference signal $SR_{N-1}$ of the plurality of reference signals $SR_1$, $SR_N$ of a value of a second term of the geometric sequence of a second interval $I_{N-1}$ of the type $[SR_{N-1}, SR_N[$, such that the first term and the second term are of equidistant order at both ends of the geometric sequence, the second term being representative of the electrical threshold for detecting Sth a power failure provided to be able to detect a electric power consumption failure of the electric charge.

In other words, when the first binary output signal $SS_2$ is in a binary state of the type '1', said first binary output signal $SS_2$ allows the closure of a single electrical switch $EC_2$ for switching the second term of the geometric sequence of the second interval $I_{N-1}$ of the type $[SR_{N-1}, SR_N[$, such that the result of the product of the first term with the second term represents the maximum reference power representative of the maximum power allowable by the electric charge. The output signal $S_{SEC2}$ of the single electrical switch $EC_2$ subjected to closure control therefore represents the electrical threshold for detecting Sth a power failure.

The other electrical switches $EC_1$, $EC_3$, $EC_{N-1}$ are configured to be controlled by the other binary output signals $SS_1$, $SS_3$, $SS_{N-1}$ so that, when these are all in a binary state of nonbelonging of the setpoint signal SC to the other intervals $I_1$, $I_3$, $I_{N-1}$ of the type $[SR_1, SR_2[$, $[SR_3, SR_4[$, $[SR_{N-1}, SR_N[$, the other electrical switches $EC_1$, $EC_3$, $EC_{N-1}$ remain open so that no other reference signal $SR_N$, $SR_{N-2}$, $SR_2$ is switched by the other electrical switches $EC_1$, $EC_3$, $EC_{N-1}$.

The advantage of this solution is to be able to monitor a power without needing a voltage/current multiplier in order to compare the calculated power with a predetermined maximum power threshold. The device allows overcoming the complexity of existing solutions by proposing a device that automatically provides an electrical threshold for detecting Sth a power failure representative of the maximum voltage or maximum current that the charge must not exceed based respectively on the supply voltage or current of the charge.

According to one embodiment of the self-adjusting device 10 represented in FIG. 2, the plurality of reference signals $SR_3$, $SR_N$ is a plurality of N reference voltages $V_1$, $V_N$ ordered from 1 to N obtained at each electrical connection node of a network of electrical resistors 18 connected in series. The electrical resistor network 18 is connected at one of its ends to a stabilized voltage $V_s$ for supplying the electrical resistor network 18 and at its other end to an electrical ground 20 of the self-adjusting device 10.

In order to obtain a plurality of N reference voltages $V_1$, $V_N$ of increasing values according to a geometric sequence with determined common ratio, the resistor network 18 comprises a plurality of N resistors $R_1$, $R_N$ ordered from 1 to N, for which the resistor values $R_2$, $R_N$ of order 2 to N increase successively at a constant ratio, the resistor $R_N$ of order N being connected to the stabilized voltage Vs for supplying the electrical resistor network 18 in series. The value of the resistor $R_1$ of order 1 connected to the electrical ground 20 is adjusted so that each reference voltage $V_1$, $V_N$, excluding zero voltage of the electrical ground, also increases according to the same constant ratio as the plurality of resistors $R_2$, $R_N$ of order 2 to N.

The plurality of N reference voltages $V_1$, $V_N$ of increasing values defines the plurality of successive intervals $I_1$, $I_{N-1}$ of the type $[V_1, V_2[, [V_2, V_3[, [V_{N-1}, V_N[$ successively bounded by the values of reference voltages $V_1$, $V_N$ at the successive electrical connection nodes. The successive intervals $I_1$, $I_{N-1}$ are ordered from 1 to N−1.

According to this embodiment, there will be considered the N reference voltages $V_1$, $V_N$ of increasing successive values ranging from $V_1$ to $V_N$ as well as the sequence of successive intervals $I_1$, $I_{N-1}$ of the type semi-open on the right, that is say of the type $[V_1, V_2[, [V_2, V_3[ \ldots$ and so on up to the interval of order N−1 of the type $[V_{N-1}, V_N[$.

According to the embodiment represented in FIG. 2, the logic signal processing means 14 include a plurality of N−1 comparators $C_1$, $C_{N-1}$ ordered from 1 to N−1, each comparator $C_1$, $C_{N-1}$ including a single reference voltage $V_1$, $V_{N-1}$ from the plurality of reference voltages $V_1$, $V_N$, each of the reference voltages $V_1$, $V_{N-1}$ being connected to a single comparator $C_1$. Each reference voltage $V_1$, $V_{N-1}$ of order 1 to N−1 is connected respectively to the negative bound of each comparator $C_1$, $C_{N-1}$ of order 1 to N−1. In other words, the reference voltage $V_1$ of order 1 is connected to the negative bound of the comparator $C_1$ of order 1, the reference voltage $V_2$ of order 2 is connected to the negative bound of the comparator $C_2$ of order 2, and so on up to the reference voltage $V_{N-1}$ of order N−1 connected to the comparator $C_{N-1}$ of order N−1.

According to the embodiment of FIG. 2, the setpoint signal Sc is a setpoint voltage Vc representative of the supply voltage of the electric charge. Each comparator $C_1$, $C_{N-1}$ is configured to compare the setpoint voltage $V_c$ with its respective reference voltage $V_1$, $V_{N-1}$ so that only the comparators $C_1$, $C_{N-1}$ having as reference voltage $V_1$, $V_{N-1}$ a voltage of amplitude lower than the amplitude of the setpoint voltage Vc can provide at the output of the comparator a 'high' logic level, i.e. a binary value of '1'. In this case, the other comparators provide at the output of the comparator a 'low' logic level, i.e. a binary value of '0.

In other words, when the amplitude of the setpoint voltage Vc is greater than a reference voltage $V_M$ of any order M from 1 to N−1, the comparators $C_1$, $C_M$ of order 1 to M provide at the output of the comparator a 'high' logic level, i.e. a binary value of '1', the comparators $C_{M+1}$, $C_{N-1}$ of order M+1 to N−1 provide at the output of the comparator a 'low' logic level, i.e. a binary value of '0'.

According to the embodiment represented in FIG. 2, the logic signal processing means 14 include a plurality N−2 of logic devices $DL_1$, $DL_{N-2}$ ordered from 1 to N−2. Each logic device $DL_1$, $DL_{N-2}$ of order 1 to N−2 provides a plurality N−2 of binary output signals $SS_1$, $SS_{N-2}$ of belonging or nonbelonging of the setpoint voltage Vc to an interval $I_1$, $I_{N-2}$ of order 1 to N−2 of the type $[V_1, V_2[, [V_{N-2}, V_{N-1}[$.

The output of the comparator $C_{N-1}$ of order N−1 directly provides a binary output signal $SS_{N-1}$ of order N−1 of belonging or nonbelonging of the setpoint voltage to the interval $I_{N-1}$ of order N−1 of the type $[V_{N-1}, V_N[$.

It is obvious that the setpoint voltage Vc cannot belong to more than one reference voltage interval $I_1$. In other words, the setpoint voltage Vc cannot be framed by more than one reference voltage interval $I_1$.

For this purpose, each logic device $DL_1$, $DL_{N-2}$ includes an inverter-type logic gate $INV_1$, $INV_{N-2}$ whose input is electrically connected to the output of the comparator $C_2$, $C_{N-1}$ of higher order. In other words, the input of the 'inverter'-type logic gate $INV_{M-1}$ of order M−1 is electrically connected to the output of the comparator CM of order M.

In addition, each logic device $DL_1$, $DL_{N-2}$ includes a two-input 'AND'-type logic gate $AND_1$, $AND_{N-2}$. Each 'AND'-type logic gate $AND_1$, $AND_{N-2}$ includes a first input electrically connected to the output of the 'inverter'-type logic gate $INV_1$, $INV_{N-2}$ of the same order, the other input of the 'AND'-type logic gate $AND_1$, $AND_{N-2}$ being electrically connected to the output of the comparator $C_1$, $C_{N-2}$ of the same order. In other words, the first input of the 'AND'-type logic gate $AND_{M-1}$ of order M−1 is electrically connected to the output of the 'inverter'-type logic gate $INV_{M-1}$ of order M−1, the other input of the 'AND'-type logic gate $AND_{M-1}$ of order M−1 is electrically connected to the comparator $C_{M-1}$ of order M−1.

According to the arrangement of the plurality of logic devices $DL_1$, $DL_{N-2}$ of the embodiment of FIG. 2, when the comparators $C_1$, $C_M$ of order 1 to M each provide a comparator output of 'high' logic level, the binary outputs $SS_1$, $SS_{M-1}$ of belonging or non-belonging of the setpoint voltage Vc to an interval $I_1$, $I_{M-1}$ of order 1 to M−1 of reference signals are then in a 'low' logic state, meaning the nonbelonging of the setpoint voltage Vc to the successive intervals $I_1$, $I_{M-1}$ of order 1 to M−1. Indeed, the 'inverter'-type logic gates $INV_1$, $INV_{M-1}$ of order 1 to M−1 set a 'low' logic state to the first input of each 'AND'-type logic gate $AND_1$, $AND_{M-1}$ of order 1 to M−1.

In this case, the comparator $C_{M+1}$ of order M+1 provides a low logic level at the input of the 'inverter'-type logic gate $INV_M$ of order M, so that the first input of the 'AND'-type logic gate $AND_M$ of order M is in a 'high' logic state.

In this case, only the binary output $SS_M$ of order M of belonging or non-belonging of the setpoint voltage Vc to an interval $I_M$ of order M of reference voltages is in a 'high' state, meaning the belonging of the setpoint voltage Vc to the single interval $I_M$ of order M.

According to the embodiment represented in FIG. 2, the self-adjusting device 10 includes a plurality N−1 of electrical switches $SW_1$, $SW_{N-1}$ ordered from 1 to N−1. Each electrical switch $SW_1$, $SW_{N-1}$ of order 1 to N−1 is respectively controlled by a binary output signal $SS_1$, $SS_{N-1}$ of belonging or nonbelonging of the setpoint voltage Vc to an interval $I_1$, $I_{N-1}$ of order 1 to N−1 of reference signals. Each electrical switch $SW_1$, $SW_{N-1}$ is in a closed or on state when its control signal is in a 'high' logic state. In other words, an electrical switch $SW_M$ of any order M is configured to switch an electrical signal present on its input toward its output when its control signal is a binary output $SS_M$ of a logic device $DL_M$ of order M indicating the belonging of the setpoint voltage to an interval $I_M$ of order M of reference signals.

Conversely, each electrical switch $SW_1$, $SW_{N-1}$ is in an open or off state when its control signal is in a 'low' logic state so that a signal present on the input of the electrical switch $SW_1$, $SW_{N-1}$ is not switched at the output of the electrical switch $SW_1$, $SW_{N-1}$.

According to the description of the plurality of logic devices $DL_1$, $DL_{N-2}$, not more than one electrical switch $SW_1$ can be subjected to closure control since a single binary output $SS_1$ of belonging or nonbelonging of the setpoint voltage Vc to an interval $I_1$ of reference signals can be in a 'high' state, meaning the belonging of the setpoint voltage Vc to a single reference voltage interval $I_1$.

According to the embodiment of FIG. 2, all the outputs of the plurality of electrical switches $SW_1$, $SW_{N-1}$ are electrically connected together so as to form the electrical threshold for detecting Sth the electric power failure consumed by the electric charge. For this purpose, the electrical threshold for detecting Sth the electric power failure is therefore the input signal of the electrical switch $SW_1$ subjected to closure control.

Indeed, according to the embodiment of FIG. 2, each input of each electrical switch $SW_1$, $SW_{N-1}$ of order 1 to N−1 is electrically connected respectively to a reference voltage of order N to 2; each electrical switch $SW_1$, $SW_{N-1}$ of order 1 to N−1 being respectively controlled by a binary output $SS_1$, $SS_{N-1}$ of order 1 to N−1, of belonging or nonbelonging of the setpoint voltage Vc to an interval $I_1$, $I_{N-1}$ of order 1 to N−1.

In other words, the input signal of the electrical switch $SW_{N-1}$ of order N−1 is electrically connected to the reference voltage $V_2$ of order 2; the input signal of the electrical switch $SW_{N-2}$ of order N−2 is electrically connected to the reference voltage $V_3$ of order 3, and so on up to the input signal of the electrical switch of order 2 electrically connected to the reference voltage $V_{N-1}$ of order N−1, and finally up to the input signal of the electrical switch $SW_1$ of order 1 electrically connected to the reference voltage $V_N$ of order N.

According to this arrangement, by virtue of the mathematical properties of the geometric sequence formed by the plurality N of the reference voltages $V_1$, $V_N$, the product of the value of the signal switched by the electrical switch $SW_1$ controlled by the binary output signal $SS_1$ of the logic device $DL_1$ indicating the belonging of the setpoint voltage Vc to a reference voltage interval $I_1$ by the value of the lower bound of said interval $I_1$ is representative of the maximum reference power representative of the maximum power allowable by the electric charge.

In other words, the threshold for detecting Sth a power failure provided by the self-adjusting device 10 is the value of the reference voltage $V_{N-1}$ of a first term of the geometric sequence of the plurality of reference voltages $V_1$, $V_N$ such that this first term and the second term of the geometric sequence representative of the lower bound of the interval $I_2$ of belonging of the setpoint voltage $V_c$ are terms equidistant from the ends of the geometric sequence of the plurality of reference voltages $V_1$, $V_N$.

According to the particular embodiment of FIG. 3, the resistor network 18 may comprise 24 resistors $R_1$, $R_{24}$ for which the theoretical value of the resistor $R_2$ of order 2 is equal to 123.74 Ohm, and for which the constant ratio between two resistors R2, R3 of successive order of 2 to 24 equal to 1.1 so that the value of the resistor R24 of order 24 is equal to 1000 Ohm. The theoretical value of the resistor $R_1$ of order 1 can be adjusted to 1242 Ohm so that the stabilized supply voltage Vs at the voltage node of order 24 decreases according to the ratio of constant order 1.1 successively up to the node of order 1, that is to say the electrical connection node between the resistor $R_1$ of order 1 and the resistor $R_2$ of order 2. The advantage of this particular embodiment lies in the fact that the values of the resistors R2, R24 of order 2 to 24 can generally correspond in practice to the successive standardized values of the resistors of the series E24, the value of the resistor $R_1$ of order 1 can also generally correspond to a standardized value of a resistor of the series E24.

For this particular non-limiting example, by having for example a stabilized voltage Vs for supplying the resistor network of 3 volts, the reference voltage $V_{24}$ of order 24 will be 3 volts, the reference voltage $V_{23}$ of order 23 will be equal to 2.73 volts and so on, the reference voltage $V_2$ of order 2 will be equal to 0.37 Volt and finally the reference voltage V of order 1 will be equal to 0.34 volt.

According to this example, it is possible to deduce the 23 successive intervals $I_1$, $I_{23}$ of reference voltages, such as for example, the two first intervals: $I_1$[0.34 Volt, 0.37 Volt[ and $I_2$[0.37 Volt, 0.41 Volt [ and the last interval $I_{23}$[2.73 Volts, 3 Volts[.

According to this example, the result of the product of two equidistant order terms at both ends of the geometric sequence formed by the reference voltages, that is to say for example, the product of the reference voltage $V_{24}$ of order 24 with the reference voltage $V_1$ of order 1, as well as the product of the reference voltage $V_{23}$ of order 23 with the reference voltage $V_2$ of order 2, or the product of the reference voltage $V_{13}$ of order 13 with the reference voltage $V_{12}$ of order 12, is of order 1.

According to this example, the plurality of the reference voltages $V_1$, $V_{24}$ is therefore dimensioned so that the self-adjusting device 10 allows monitoring at least one electrical device, such as a vehicle electric charge, that must not consume a maximum power greater than 1 Watt, the maximum power being the reference power defined by the self adjusting device 10.

According to FIG. 3, the setpoint voltage Vc is an electric voltage that can vary from 0 Volt to 3 Volts. This setpoint voltage Vc can be an image of the battery voltage. According to this example, a device for reducing a factor 6 of the battery voltage allows the self-adjusting device 10 to have a reduced voltage of the battery as a setpoint voltage Vc.

According to this example, the self-adjusting device 10 comprises 24 comparators $C_1$, $C_{24}$ ordered from 1 to 24. Each comparator $C_1$, $C_{24}$ comprises respectively on its negative input bound a reference voltage $V_1$, $V_{24}$ of order 1 to 24. In other words, the comparator $C_1$ of order 1 comprises a reference voltage $V_1$ on its negative bound of 0.34 Volt, the comparator $C_2$ of order 2 comprises a reference voltage $V_2$ on its negative bound of 0.37 Volt, and so on up to the comparator $C_{23}$ of order 23 comprising a reference voltage $V_{23}$ of 2.73 volts, the comparator $C_{24}$ of order 24 comprising as reference voltage $V_{24}$ the stabilized voltage Vs for supplying the resistor network 18 namely 3 volts.

The comparator $C_{24}$ of order 24, not present in the embodiment of FIG. 2, is an option for managing the overvoltage situations beyond the maximum estimated voltage of the battery voltage. This comparator does not question the operation of the self-adjusting device 10 as described according to FIG. 2.

According to FIG. 3, in the case of a setpoint voltage Vc of 1.0 Volt, all the comparators $C_1$, $C_{12}$ having a reference voltage $V_1$, $V_{12}$ less than 1.0 Volt provide at the output of the comparator $C_1$, $C_{12}$ a 'high' logic level, i.e. a binary value of '1', the comparators $C_{13}$, $C_{24}$ having a reference voltage greater than 1.0 Volt provide at the output of the comparator $C_{13}$, $C_{24}$ a 'low' logic level, i.e. a binary value of '0'. According to this example, the comparators $C_1$, $C_{12}$ of order 1 to 12 provide at the output of the comparator $C_1$, $C_{12}$ a high logic level, the comparators $C_{13}$, $C_{24}$ of order 17 to 24 provide at the output of the comparator a low logic level.

According to FIG. 3, the self-adjusting device 10 comprises 23 logic devices ordered from 1 to 23.

Each of the 23 logic devices includes an 'inverter'-type logic gate $INV_1$, $INV_{23}$ ordered from 1 to 23. According to a setpoint voltage Vc of 1.0 Volt, the input signal of each 'inverter'-type logic gate $INV_{12}$, $INV_{23}$ of order 12 to 23 is a 'low' logic level, i.e. a binary value of '0' provided respectively by the comparators $C_{13}$, $C_{24}$ of order 13 to 24. A contrario, the input of each 'inverter'-type logic gate $INV_1$, $INV_{11}$ of order 1 to 11 is a 'high' logic level, i.e. a binary value of '1' provided respectively by the comparators $C_2$, $C_{12}$ of order 2 to 12.

Each of the 23 logic devices includes an 'AND'-type logic gate $AND_1$, $AND_{23}$ ordered from 1 to 23. Each of the 'AND'-type logic gates $AND_1$, $AND_{23}$ of order 1 to 23 comprises a first input electrically connected respectively to the output of each of the 'inverter' type logic gates $INV_1$, $INV_{23}$ of order 1 to 23. Each of the 'AND'-type logic gates $AND_1$, $AND_{23}$ of order 1 to 23 comprises a second input electrically connected respectively to the output of each of the comparators $C_1$, $C_{23}$ of order 1 to 23.

According to the setpoint voltage Vc of 1.0 Volt, each of the 'AND'-type logic gates $AND_{13}$, $AND_{23}$ of order 13 to 23 provides a binary output $SS_{13}$, $SS_{23}$ of non-belonging of the setpoint voltage Vc to the intervals $I_{13}$, $I_{23}$ of order 13 to 23, i.e. a binary output $SS_{13}$, $SS_{23}$ of 'low' logic level, i.e. a binary value of '0'. Indeed, the setpoint voltage Vc of 1.0 Volt being lower than the reference voltage $V_{13}$ of order 13, namely a voltage value of 1.06 Volt, the logic outputs of the comparators $C_{13}$, $C_{23}$ of order 13 to 23 provide respectively to each 'AND'-type logic gate $AND_{13}$, $AND_{23}$ of order 13 to 23, their second input signal of 'low' logic level, i.e. a binary value of '0'.

According to the setpoint voltage Vc of 1.0 Volt, the 'AND'-type logic gate $AND_{12}$ of order 12 provides a binary output $SS_{12}$ of belonging of the setpoint voltage Vc to the interval $I_{12}$ of order 12, i.e. a binary output $SS_{12}$ of 'high' logic level of binary value equal to '1' since the value of the setpoint voltage Vc of 1.0 Volt is framed by the interval $I_{12}$ of order 12 bounded by the reference voltage $V_{12}$ of order 12 and the reference voltage $V_{12}$ of order 13 namely the interval semi-open on the right [0.96 Volt, 1.6 Volt[.

Indeed, since the setpoint voltage Vc of 1.0 Volt is greater than the low reference voltage $V_{12}$ of the interval $I_{12}$ of order 12, namely a voltage value of 0.96 Volt, the comparator $C_{12}$ of order 12 provides to the second input of the 'AND'-type logic gate $AND_{12}$ of order 12 a 'high' logic level, i.e. a binary value of '1'. Since the first input of the 'AND'-type logic gate $AND_{12}$ of order 12 is connected to the output of the 'inverter'-type logic gate $INV_{12}$ of order 12, since said 'inverter'-type logic gate $INV_{12}$ of order 12 has as input signal the output of the comparator $C_{13}$ of order 13, i.e. a 'low' logic level, because the setpoint voltage Vc has a value lower than the reference voltage $V_{13}$ of the comparator of order 13, then the first input of the 'AND'-type logic gate $AND_{12}$ of order 12 has a 'high' logic level, i.e. a binary value of '1'.

The two inputs of the 'AND'-type logic gate $AND_{12}$ of order 12 having a 'high' logic level, i.e. a binary value of '1', said 'AND'-type logic gate $AND_{12}$ of order 12 provides to the self-adjusting device 10 a binary output $SS_{12}$ of order 12 of belonging of the setpoint voltage Vc to the interval $I_{12}$ of order 12, i.e. a binary output $SS_{12}$ of 'high' logic level, i.e. a binary value of '1'.

According to the setpoint signal of 1.0 Volt, each 'AND'-type logic gate $AND_1$, $AND_{11}$ of order 1 to 11 provides a binary output $SS_1$, $SS_{11}$ of nonbelonging of the setpoint voltage Vc to the intervals $I_1$, $I_{11}$ of order 1 to 11, i.e. a binary output $SS_1$, $SS_{11}$ of 'low' logic level, i.e. a binary value of '0', since the setpoint signal of 1.0 Volt is not framed by any interval $I_1$, $I_{11}$ of order 1 to 11; namely the first interval $I_1$ of the type semi-open on the right [0.34 Volt, 0.37 Volt], the second consecutive interval $I_2$ [0.37 Volt, 0.41 Volt[ and so on up to the eleventh interval $I_{11}$ bounded by the reference voltage $V_{11}$ of order 11 and the reference voltage $V_{12}$ of order 12, namely the interval semi-open on the right [0.87 Volt, 0.96 Volt[.

Indeed, each comparator $C_2$, $C_{12}$ of order 2 to 12, respectively provides to each 'inverter'-type logic gate $INV_1$, $INV_{11}$ of order 1 to 11, an input signal of 'high' logic level, i.e. a binary value of '1'. Indeed, the value of the reference voltage $V_2$, $V_{12}$ of each comparator of order 2 to 12 is less than the value of the setpoint voltage Vc. For example, the reference voltage $V_{12}$ of the comparator $C_{12}$ of order 12 is equal to 0.96 Volt. As a result, each first input of each 'AND'-type logic gate $AND_1$, $AND_{11}$ of order 1 to 11 has a 'low' logic level, i.e. a binary value of '0'. As a result, each 'AND'-type logic gate $AND_1$, $AND_{11}$ of order 1 to 11 provides a binary output $SS_1$, $SS_{11}$ of nonbelonging of the setpoint voltage Vc of a value equal to 1.0 Volt to the intervals $I_1$, $I_{11}$ of order 1 to 11.

According to the setpoint voltage of a value equal to 1.0 Volt, only the binary output signal $SS_{12}$ of order 12 of the logic signal processing means 14 provides a signal of belonging of the setpoint voltage Vc to an interval $I_{12}$ of reference voltages, namely the belonging of the setpoint voltage Vc of 1.0 Volt to the interval $I_{12}$ of order 12, namely the interval $I_{12}$ semi-open on the right [0.96 Volt, 1.06 Volt[.

According to FIG. 3, the self-adjusting device 10 of the electrical detection threshold Sth includes 24 electrical switches $SW_1$, $SW_{24}$ ordered from 1 to 24. Each electrical switch $SW_1$, $SW_{23}$ of order 1 to 23 is respectively controlled by the binary output $SS_1$, $SS_{23}$ of belonging or nonbelonging of the setpoint voltage Vc to a determined interval $I_1$, $I_{23}$, the binary outputs $SS_1$, $SS_{23}$ being respectively the outputs of the 'AND'-type logic gate $AND_1$, $AND_{23}$ of order 1 to 23. The electrical switch $SW_{24}$ of order 24 is controlled directly by the output of the comparator $C_{24}$ of order 24.

The outputs of the electrical switches $SW_1$, $SW_{24}$ of order 1 to 24 are connected together and provide the electrical threshold for detecting Sth an electric power failure. For this purpose, each of the 24 electrical switches $SW_1$, $SW_{24}$ is subjected to closure control when its control signal is in a 'high' logic state. In this case no more than a single electrical switch $SW_{12}$ is subjected to closure control since no more than a single binary output $SS_{12}$ of belonging or nonbelonging of the setpoint voltage Vc to an interval $I_{12}$ of reference voltages can assume a belonging state, i.e. a 'high' logic state.

According to the setpoint voltage Vc of a value equal to 1.0 Volt, only the binary output signal $SS_{12}$ of order 12 of the logic signal processing means 14 provides a signal of belonging of the setpoint voltage Vc to the interval $I_{12}$ of order 12. As a result, only the electrical switch $SW_{12}$ of order 12 is switched on or closed, so that the input signal of the electrical switch $SW_{12}$ of order 12 is switched on the output of the electrical switch $SW_{12}$ of order 12.

According to the embodiment of FIG. 3, each input of each electrical switch $SW_1$, $SW_{24}$ of order 1 to 24 is electrically connected respectively to a reference voltage $V_{24}$, $V_1$ of opposite order 24 to 1. In other words, the input of the electrical switch of order 1 is connected to the reference voltage of order 24, the input of the electrical switch $SW_1$ of order 1 is connected to the reference voltage $V_{24}$ of order 24, and so on up to the input of the electrical switch $SW_{24}$ of order 24 connected to the reference voltage of order 1, so that the product of the reference voltage of each comparator $C_1$, $C_{24}$ of order 1 to 24 by respectively each reference voltage $V_{24}$, $V_1$ of the input signal of each electrical switch $SW_1$, $SW_{24}$ of order 1 to 24 is constant and representative of the maximum reference power (Pref), namely 1 Watt.

According to FIG. 3, the setpoint voltage of a value equal to 1.0 Volt belongs to the interval $I_{12}$ of reference voltage of order 12 bounded by the reference voltage $V_{12}$ of order 12 of a value equal to 0.96 Volt and by the reference voltage $V_{13}$ of order 13 of a value equal to 1.06 Volt. The lower bound of the interval $I_{12}$ of order 12 is the reference voltage $V_{12}$ of the comparator $C_{12}$ of order 12. The input signal of the electrical switch $SW_{12}$ of order 12 is therefore connected to the reference voltage $V_{13}$ of order 13. The order of the reference voltage $V_{13}$ of the input signal of the switch $SW_{12}$ of order 12 and the order of the reference voltage $V_{12}$ of the comparator $C_{12}$ of order 12 are two terms of the geometric sequence of the plurality of reference voltages equidistant from the ends of the sequence of order 24. Indeed, the reference voltage $V_{12}$ of order 12 is at a distance of 12 from the reference voltage $V_{24}$ of order 24, the reference voltage $V_{24}$ of order 24 representing the upper end of the geometric sequence, the reference voltage $V_{13}$ of order 13 being at a distance of 12 from the reference voltage $V_1$ of order 1, the reference voltage $V_1$ of order 1 representing the low end of the geometric sequence.

Consequently, according to the setpoint voltage of a value equal to 1.0 Volt, the electrical switch $SW_{12}$ of order 12 provides an electrical threshold for detecting Sth an electric power failure of absolute value equivalent to the reference voltage $V_{13}$ of order 13, namely 1.06. The product of the reference voltage $V_{12}$ of order 12, corresponding to a first term of the geometric sequence, by the reference voltage $V_{13}$ of order 13 representing a second term of the geometric sequence is therefore 0.96×1.06, namely a value equal to 1.0 comparable to the predetermined maximum reference power of 1 W.

According to the embodiments of FIGS. 1, 2 and 3, the invention also comprises a method for determining 100 an electrical threshold for detecting Sth an electric power failure consumed by an electric charge, preferably an electric charge of a motor vehicle. The method 100 comprises a first step of determining 110 the maximum reference power (Pref) representative of the allowable maximum power of the electric charge. The step of determining 110 the maximum reference power allows dimensioning the geometric sequence of reference signals such that the product of two terms equidistant from the ends of the geometric sequence is equivalent to the reference power.

A second step 120 of the method 100 consists in providing a plurality of reference signals $SR_1$, SRN of increasing values according to a geometric sequence for which the product of two equidistant order terms at both ends of the sequence equals the maximum reference power (Pref); the plurality of reference signals $SR_1$, SRN being representative of the variation of a supply signal of the electric charge.

The plurality of reference signals $SR_1$, $SR_N$ allows among others framing a setpoint signal Sc representative of the power supply of the electric charge by two successive values of reference signals $SR_1$, $SR_2$ so as to be able to approximate the setpoint signal Sc to a reference signal $SR_1$.

As a result, the method comprises a third step of defining 130 a plurality of successive intervals $I_1$, $I_{N-1}$ successively bounded by the terms of the geometric sequence of the plurality of reference signals $SR_1$, $SR_N$ and also a fourth step of providing 140 the setpoint signal Sc representative of the supply signal of the electric charge.

To frame the setpoint signal, the method comprises a fifth step of allocating 150 to the setpoint signal Sc a first term of the geometric sequence of an interval $I_1$ of reference signals framing as close as possible the value of the setpoint signal Sc.

Finally, in order to be able to provide the electrical threshold for detecting an electric power failure, the method comprises a sixth step of allocating 160 to the electrical threshold for detecting Sth a failure of electric power consumed by the electric charge a second term of the geometric sequence of reference signals such that the first term and the second term are of equidistant order at both ends of the sequence.

The invention claimed is:

1. A device for self-adjusting an electrical threshold for detecting an electric power consumption failure of an electric charge, the self-adjusting device comprising:
   a plurality of reference signals of increasing values according to a geometric sequence for which the product of two terms of equidistant order at both ends of the sequence equals a maximum reference power; the plurality of reference signals being representative of the variation of a supply signal of the electric charge;
   a setpoint signal representative of the supply signal of the electric charge;
   a framing unit including:
      a plurality of successive intervals of reference signals successively bounded by the terms of the geometric sequence of the plurality of reference signals;
      a plurality of binary output signals;
      a logic signal processing means configured to assign to a first binary output signal of the plurality of binary output signals a binary state of belonging of the setpoint signal to a first interval of reference signals including a first term of the geometric sequence; and
   at least one electrical switch configured to be controlled by the first binary output signal and configured to provide a reference signal of the plurality of reference signals of a value of a second term of the geometric sequence, such that the first term and the second term are of equidistant order at both ends of the geometric sequence, the second term being representative of the self-adjusted electrical threshold for detecting an electric power consumption failure of the charge.

2. The self-adjusting device of claim 1, characterized in that the logic signal processing means are configured to assign to the other binary output signals of the plurality of binary output signals a binary state of non-belonging of the setpoint signal to the other intervals of reference signals.

3. The self-adjusting device of claim 1, characterized in that the plurality of reference signals comprise successive electrical connection nodes of a resistor network in series.

4. The self-adjusting device of claim 1, wherein the logic signal processing means further includes:
   a plurality of comparators ordered from 1 to N each comprising respectively a reference signal ordered from 1 to N of the plurality of reference signals, each comparator also comprising the setpoint signal, so as to be able to compare the setpoint signal with each reference signal;
   a plurality of logic devices ordered from 1 to N−1 comprising:
      a plurality of 'inverter'-type logic gates ordered from 1 to N−1, each input of each 'inverter'-type logic gates of order 1 to N−1 being respectively electrically connected to the output of each comparator of order 2 to N;
      a plurality of two-input 'AND'-type logic gates ordered from 1 to N−1, each first input of each two-input 'AND'-type logic gate ordered from 1 to N−1 being respectively electrically connected to each output of each 'inverter'-type logic gate ordered from 1 to N−1, each second input of each two-input 'AND'-type logic gate ordered from 1 to N−1 being respectively electrically connected to each ordered output of each comparator of order 1 to N−1;
      wherein the output of each of the 'AND'-type logic gates of order 1 to N−1 including respectively the plurality of binary output signals ordered from 1 to N−1 of the framing unit.

5. A method for determining an electrical threshold for detecting a failure of electric power consumed by an electric charge, the method comprising:
   determining a maximum reference power representative of the maximum allowable power of the electric charge;
   providing a plurality of reference signals of increasing values according to a geometric sequence for which the product of two terms of equidistant order at both ends of the geometric sequence equals the maximum reference power, wherein the plurality of reference signals being representative of the variation of a supply signal of an electric charge;
   defining a plurality of successive intervals of reference signals successively bounded by the terms of the geometric sequence of the plurality of reference signals;
   providing a setpoint signal representative of the supply signal of the electric charge;
   allocating to the setpoint signal a first term of the geometric sequence of an interval of reference signals framing as close as possible the value of the setpoint signal;
   allocating to the electrical threshold for detecting a failure of electric power consumed by the electric charge a second term of the geometric sequence of reference signals such that the first term and the second term are of equidistant order at both ends of the sequence.

6. A device for self-adjusting an electrical threshold for detecting an electric power consumption failure of an electric charge, the self-adjusting device comprising:
   an input for receiving a setpoint signal representative of a monitored current or monitored voltage of the electric charge;
   a plurality of reference signals, each reference signal corresponding to possible values of the monitored current or monitored voltage associated with the electric charge, wherein the plurality of reference signals increase in value according to a geometric sequence for which the product of two terms of equidistant order at both ends of the sequence equals a maximum reference power, wherein successive pairs of reference signals each define an interval;
   a framing unit configured to receive the setpoint signal and the plurality of reference signals as input and to generate a plurality of outputs, wherein the framing unit compares the setpoint signal to the plurality of reference signals to identify the interval to which the setpoint signal belongs, wherein one of the plurality of outputs presents a logic level indicating the interval to which the setpoint signal belongs, and wherein the interval to which the setpoint signal belongs represents a first term corresponding with the geometric sequence;
   generating an output representing the self-adjusted threshold value based on the output generated by the framing unit indicating the interval to which the setpoint signal belongs, wherein the output represents a second term corresponding with the geometric sequence and is selected from the plurality of reference signals so that the first term and the second term are equidistant from respective ends of the geometric sequence, wherein a product of the first term and the second term represent a maximum power of the electric charge.

7. The device of claim 6, wherein the setpoint signal represents a monitored voltage of the electric charge and the self-adjusted threshold represents a current threshold self-adjusted based on the monitored voltage of the electric charge.

8. The device of claim 7, wherein the setpoint signal represents a monitored current of the electrical charge and the self-adjusted threshold represents a voltage threshold self-adjusted based on the monitored current of the electrical charge.

9. The device of claim 6, wherein the plurality of reference signals are selected such that a product of any two terms equidistant from the respective ends of the geometric sequence represents a maximum power threshold of the electrical charge.

* * * * *